United States Patent [19]

Eichelberger et al.

[11] 4,074,851
[45] Feb. 21, 1978

[54] METHOD OF LEVEL SENSITIVE TESTING A FUNCTIONAL LOGIC SYSTEM WITH EMBEDDED ARRAY

[75] Inventors: Edward Baxter Eichelberger, Purdy Station, N.Y.; Eugen Igor Muehldorf, Potomac, Md.; Ronald Gene Walther, Vestel, N.Y.; Thomas Walter Williams, Longmont, Colo.

[73] Assignee: International Business Machines Corporation, Armonk, N.Y.

[21] Appl. No.: 701,054

[22] Filed: June 30, 1976

[51] Int. Cl.² .............................................. G06F 11/00
[52] U.S. Cl. ................................. 235/302; 324/73 AT
[58] Field of Search .................... 235/153 AC, 151.31; 324/73 R, 73 AT, 73 PC, 57 DE

[56] References Cited

U.S. PATENT DOCUMENTS

| 3,633,016 | 1/1972 | Walker et al. | 324/73 R X |
| 3,761,695 | 9/1973 | Eichelberger | 235/153 AC |
| 3,916,306 | 10/1975 | Patti | 235/153 AC X |

OTHER PUBLICATIONS

P. V. Jordon, "Integrated Circuit Testing" IBM Tech. Disclosure Bulletin, vol. 13, No. 5 Oct. 1970, pp. 1093–1094.

P. Goel et al., "Testing of Random Logic" IBM Tech. Disclosure Bulletin, vol. 16, No. 2, July 1973, pp. 429–430.

*Primary Examiner*—David H. Malzahn
*Attorney, Agent, or Firm*—Wesley DeBruin

[57] ABSTRACT

Level sensitive testing is performed on a generalized and modular logic with embedded array system that is utilized as an arithmetic/logical unit in a digital computer. Each arithmetic/logical unit of a computer is formed of arrangements of combinational logic networks, arrays and storage circuitry. The storage circuitry has the capability for performing scan-in/scan-out operations independently of the system input/output and controls. Using the scan capability, the method of the invention provides for the state of the storage circuitry to be preconditioned and independent of its prior history. Test patterns from an automatic test generator are cycled through the networks of combinational logic and arrays and their respective associated storage circuitry for removal through the scan arrangement to determine their fault status.

26 Claims, 13 Drawing Figures

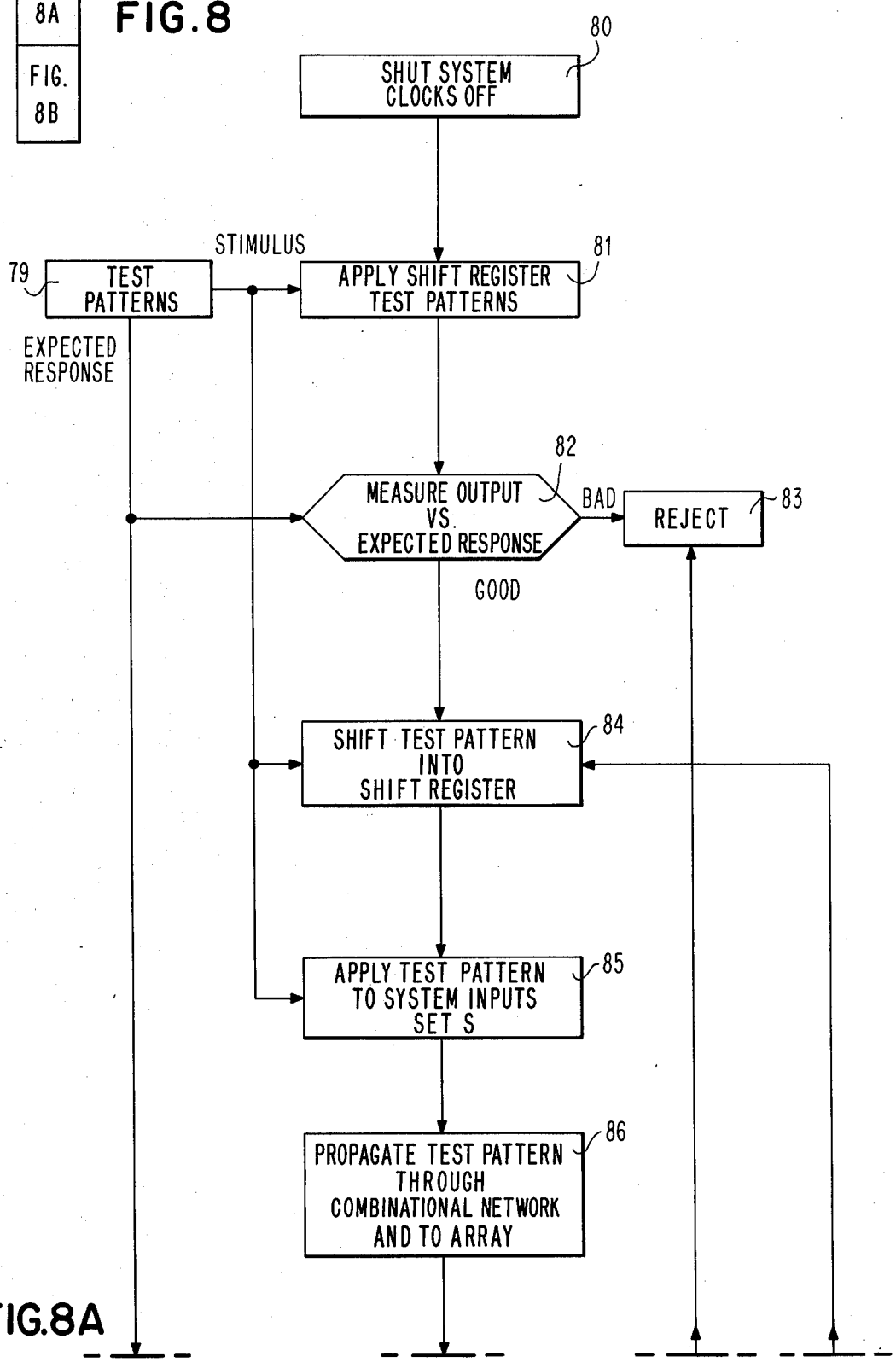

METHOD OF LEVEL SENSITIVE TESTING A FUNCTIONAL LOGIC SYSTEM WITH EMBEDDED ARRAY

CROSS-REFERENCE TO RELATED APPLICATIONS AND PATENTS

U.S. Patent Application Ser. No. 701,041, entitled "Method of Propagation Delay Testing a Level Sensitive Embedded Array Logic System" filed June 30, 1976 by Messrs. E. B. Eichelberger, E. I. Muehldorf, R. G. Walther and T. W. Williams, and of common assignee U.S. Patent Application Ser. No. 701,052, entitled "Level Sensitive Embedded Array Logic System", filed June 30, 1976 by Messrs. E. B. Eichelberger, E. I. Muehldorf, R. G. Walther and T. W. Williams, and of common assignee.

U.S. Patent Application Ser. No. 701,053, entitled "Reduced Overhead for Gated B Clock Testing" filed June 30, 1976 by Messrs. E. B. Eichelberger and T. W. Williams and of common assignee.

U.S. Patent Application Ser. No. 589,231, entitled, "High Density Semiconductor Chip Organization" by E. B. Eichelberger and G. J. Robbins, filed June 23, 1975 granted as U.S. Pat. No. 4,006,492 on Feb. 1, 1977 and of common assignee.

U.S. Patent Application Ser. No. 701,055, entitled "Implementation of Level Sensitive Logic System Employing Accordion Shift Register Means" by Hua-Tung Lee, filed June 30, 1976 and of common assignee.

U.S. Patent application Ser. No. 701, 376, entitled "Clock Generation Network" by E. B. Eichelberger and S. DasGupta, filed June 30, 1976 and of common assignee.

U.S. Patent application Ser. No. 534,606, filed Dec. 20, 1974 entitled "Testing Embedded Arrays" by E. B. Eichelberger, granted as U.S. Pat. No. 3,961,252 on June 1, 1976 and of common assignee.

U.S. Patent Application Ser. No. 534,608, entitled "Testing Embedded Arrays" by J. R. Cavalieri and R. Robortaccio, filed Dec. 20, 1974, granted as U.S. Pat. No. 3,961,254 on June 1, 1976 Mar. 19, 1976 and of common assignee.

U.S. Patent application Ser. No. 534,605, entitled "Testing Embedded Arrays" filed Dec. 20, 1974 by W. P. Hurley and H. P. Muhlfeld, granted as U.S. Pat. No. 3,961,251 on June 1, 1976 and of common assignee.

U.S. Pat. No. 3,783,254, entitled "Level Sensitive Logic System", application Ser. No. 297,543, filed Oct. 16, 1972 granted Jan. 1, 1974 to Edward B. Eichelberger and of common assignee.

U.S. Pat. No. 3,761,695, entitled "Method of Level Sensitive Testing a Functional Logic System", application Ser. No. 298,087, filed Oct. 16, 1972, granted Sept. 25, 1973 to Edward B. Eichelberger and a common assignee.

U.S. Patent No. 3,784,907, entitled "Method of Propagation Delay Testing A Functional Logic System", application Ser. No. 298,071, filed Oct. 16, 1972, granted Jan. 8, 1974 to Edward B. Eichelberger and of common assignee.

BACKGROUND OF THE INVENTION

1. Field of the Invention

This invention relates to logic and array system testing and, more particularly, to the level sensitive testing of functional organizations of a logic array system utilized in digital computers and the like.

2. Description of the Prior Art

In the past, the designer of computer logic has had complete flexibility in arranging logic circuitry and arrays to implement system and sub-system logic functions in central processing units, channels and control units employed in digital computing apparatus and the like. A significant variety of design implementations has resulted from the exercise of this flexibility. Each of these implementations has its own special dependency on the characteristics of the individual circuits employed in the system. The interface that existed between the logic designer and component manufacturer as a result of these implementations was reasonably well defined and the approach of the past could be supported in component manufacturing since the parameters of the circuits could rather readily be tested.

With the advent of large scale integration, however, this well defined and reliably tested interface no longer exists. Large scale integration, as is well known, provides the ability for the logic designer as well as the component manufacturer, to maximize the capacity for placing hundreds of circuits on a single chip of semiconductive material or a complete array on a single chip. Such an ability offers the potential for reducing power, increasing speed, and significantly reducing the cost of digital circuits. However, with such highly dense configurations, it is impossible or impractical to test each circuit or array for all of the well known circuit parameters. As a result, it is necessary to partition and divide logic and array systems and subsystems into functional units having characteristics that are substantially insensitive to these individual parameters. A generalized and modular logic system with embedded arrays, of this type is described in application Ser. No. 701,052 entitled "Level Sensitive Embedded Array Logic System" filed June 30, 1976 by Messrs E. B. Eichelberger, E. I. Muehldorf, R. G. Walther and T. W. Williams and assigned to the same assignee. Such functional units require testing methods that measure the performance of the entire functional package. The testing methods of the past are unable to determine the performance of such functional units.

In the past, for example, each individual circuit and array has been tested for the usual and normal ac and dc parameters. Access to the modular unit for applying the input test conditions and measuring the output responses has been achieved through a fixed number of input/output connection pins. However, in the realm of large scale integrated functional units, the same number of input/output pins are available, but there is considerably more circuitry and arrays.

Thus, in a typical module containing 100 chips with logic chips having up to six hundred circuits (averaging 400 circuits) and 25 array chips, the module would contain at least 30,000 circuits and 25 array chips. Parametric tests cannot be performed on individual circuit units. Accordingly, the testing must be performed on an entire functional logic unit, be it at the chip level, the modular level, or other level.

As is known, the functional units of a logic system are formed of combinational logic, and arrays as well as sequential circuits. Although computational procedures are available for computing tests and test patterns for combinational circuits, such procedures are exceedingly difficult to apply for sequential circuits with arrays and no general solution has yet been found to the problem of generating test patterns for complicated sequential logic circuits. These latter circuits are dependent on their prior history as well as any test patterns that are applied to them, consequently, it is necessary that all sequential circuitry in a logic system be effectively reduced to combinational circuitry to effectuate a test procedure on a network of circuits. The aforecited application describes logic circuitry capable of effectively rendering the circuitry combinational plus array in form. Automatic test pattern generation may then be utilized in providing test patterns for the entire logic system.

SUMMARY OF THE INVENTION

In accordance with an aspect of the invention, the method of testing is implementable on a generalized logic system with embedded array having a scan-in/scan-out capability. It is applicable to all levels of the hierarchy of modular units. The method of the invention is applicable to such generalized logic systems having a single-sided delay dependency and in which the functional logic units are made solely dependent on the occurrence of plural system clock trains.

Logical units testable according to the method of the invention employ clocked dc latches for all internal storage circuitry in the arithmetic/logical units of the computing system. This latch circuitry is partitioned along with associated combinational logic networks and arranged in sets. The plural clock trains are synchronous but non-overlapping and independent. The sets of latch circuitry are coupled through combinational logic and arrays to other sets of latches that are controlled by other system clock trains.

To accomplish scan-in/scan-out in performing the inventive test method, each latch circuit includes additional circuitry so that each latch functions as a shift register latch having input/output and shift controls that are independent of the system clocks and the system input/outputs. All of these shift register latches are coupled together to form a single shift register having a single input, a single output and shift controls. With the additional circuitry, all of the system clocks can be de-activated, isolating all of the sets of latch circuits from one another. The effect of this isolation coupled with the scan-in/scan-out capability is to reduce all of the sequential circuitry to combinational circuitry plus arrays. This permits automatically generated test patterns to be provided for measuring the functioning of the entire logical unit.

According to the method, with all system clocks in an off condition and the write control off, the shift function is checked for proper operation by scanning in the stimuli of a pattern of binary ones and zeros using the shift controls. A comparison is made of this scanned-in stimuli with the responses of the pattern propagated through the stages of the shift register. Any fault in the register may then be isolated.

The automatically generated stimuli of the test patterns are then provided one at a time to the functional logical unit being measured. Each set of stimuli of a pattern is shifted into the register and also provided as input signals to the functional unit. The contents of the shift register latches are measured at the unit outputs against the expected responses of the particular test pattern, thereby obtaining an initial indication of the state of the storage circuits. The effect of scanning the test pattern into the shift register is to negate the past history of the sequential circuitry and effectively to cause these sequential circuits to be combinational in nature.

In the test method, the stimuli supplied to the unit inputs as well as the unit generated inputs from the shift register latches propagate through the networks of combinational logic and to the array. One system clock is exercised gating the output from one logic network to the associated stages of the shift register. Employing the independent shift controls, the contents of the register are shifted out for comparison with the expected responses of the test pattern. By controlling the system clocks associated with predetermined logical networks, the performance of each of the networks in a functional logic unit may be ascertained. Repeating this procedure with additional test patterns from the automatic test generator provides a clear indication of the fault status of the unit.

DESCRIPTION OF THE DRAWINGS

FIG. 8 shows how FIGS. 8A and 8B are to be placed together to disclose a flow diagram of the steps involved in the method of the invention.

DESCRIPTION OF THE PREFERRED EMBODIMENT

Figure 1:
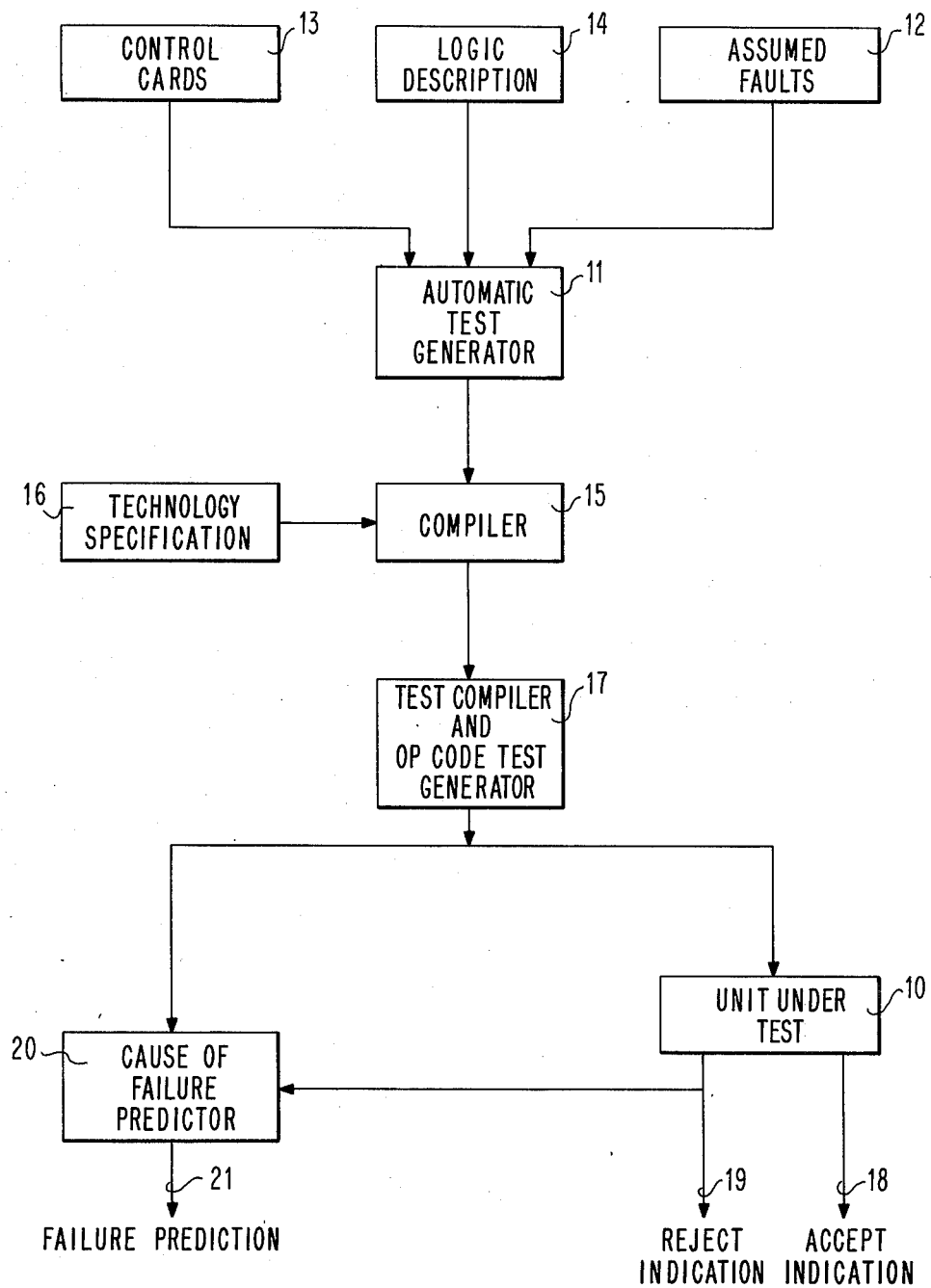
FIG. 1 is a block diagram of a testing system which may be employed in carrying out the method of the invention.

The testing method of the invention may be utilized to level sensitive test the functioning of generalized and modular logic systems having a single-sides delay dependency and a scan-in/scan-out capability. Such systems are described with particularity in the aforecited copending application Ser. No. 701,052, entitled "Level Sensitive Embedded Array Logic System", filed June 30, 1976 by Messrs. E. B. Eichelberger, E. I Muehldorf, R. G. Walther, and T. W. Williams, and of common assignee herewith.

Systems of this type are employed in the arithmetic logical units (ALU) of a computing system, and form a substantial functional part of a central processing unit, a channel or a control unit in the computing system.

The logic configuration of such a system, in addition to having a single-sided delay dependency, is organized so that correct operation of the structure is not dependent on rise time, fall time or minimum delay of any individual circuit in a logical unit. The only dependency is that the total delays through a number of levels or arrays is less than some known value. Such a configuration is referred to as a level sensitive.

For purposes of definition, a logic system is "level sensitive" if, and only if, the steady state response to any allowed input state change is independent of the circuit and wire delays within the system. Also, if an input stage change involves the changing of more than one input signal, then the response must be independent of the order in which they change.

It is readily apparent from this definition that the concept of level sensitive operation is dependent on having only allowed input changes. Thus, a level sensitive configuration includes some restriction on how the changes in the input signal occur. As described in the aforecited application, these restrictions on input changes are applied almost exclusively to the system clocking signals and array clocks, if any. Other input signals such as data signals virtually no restrictions on when they may occur.

The term "steady state response" refers to the final value of all internal storage elements such as flip flops or feedback loops. A level sensitive system is assumed to operate as a result of a sequence of allowed input stage changes with sufficient time lapse between changes to allow the system to stabilize in the new internal state. This time duration is normally assured by means of the system clock signal trains that control the dynamic operation of the logic configuration.

The logic organization of such a system also incorporates the concept of configuring all internal storage elements excluding arrays, so that they may function as shift registers or portions of shift registers having access and controls independent of the system access and controls. To implement this concept, all storage within the logic organization is accomplished by utilizing latches that are free of hazards or race conditions, thereby obtaining logic systems that are insensitive to any ac characteristics. These latches are also level sensitive. In utilizing this shift register configuration, the scan-in/scan-out capability is realized.

The system is driven by two or more non-overlapping clock signal trains that are independent of each other. Each of the signals in a train need have a duration sufficient to set a latch, read an array or write an array. The excitation signal and the gating signal for any clocked latch or array are a combinational logic function of the system input signals and the output signals from latches that are controlled by clock signal trains other than the train providing an input to such clocked latch.

One way to accomplish this latter objective is to have each such clocked latch controlled by exactly one of the system clock signals. When the gating signal and clock signal are both in an "on" or "up" condition, the clocked latch is set to the state determined by the excitation signal for that latch.

With a logic system organization according to these requirements, test patterns provided by an automatic test generator are supplied for accomplishing the functional testing of the logic system according to the method of the invention. In the test generation system of FIG. 1, test patterns are provided to a unit under test 10. Such a unit is formed using the fabrication methods of large scale integration. It may be the lowest level unit of integration such as a semiconductor chip having hundreds of circuits contained with it plus arrays or it may be a larger modular unit containing thousands of such circuits and arrays. In all instances, it satisfies the requirements of single-sided delay dependency and scan-in/scan-out capability. A more complete description of such an organization is described more particularly hereinafter.

The test patterns supplied to unit under test 10 include both stimuli and the responses expected from the particular unit when acted on by a particular stimuli. The patterns are generated by an automatic test system which is included as a part of a general purpose digital computer. Such a computing system which may be employed to accomplish this objective is a System 370 Model 158 or Model 168. Such a system would include back up storage of one megabyte.

The organization of the system includes an automatic test generator 11 having a library of assumed faults 12 stored within it. It also includes the control cards 13 including all parameters necessary for generating the test patterns.

The control cards 13 contain the procedures for operation and determine what routines and sub-routines must be employed for accomplishing the testing on the particular unit under test. The assumed faults 12 are an algorithm for each type of circuit arrangement or network that may be tested. To determine the particular patterns to be generated, the logic description of the particular unit under test 10 is provided at 14 to automatic test generator 11. Logic description 14 consists of the physcial design of the particular unit and is employed as a basis for determining the particular test and the possible failures that may occur, such as short failures.

Automatic test generator 11 provides the logic patterns that must be applied to the specific unit under test as defined by its logic description 14. These logic patterns are provided to a compiler 15 in the system which also accepts specifications 16 from the particular technology employed in the unit under test. These specifications 16 consist of the values of voltages and currents that must be employed in that technology for the binary ones and zeros of the logic pattern. Compiler 15 provides technology patterns of binary ones and zeros at specific voltages and currents to test compiler and operation code test generator 17. Compiler and generator 17 provides the particular patterns that are supplied to unit under test 10.

As already indicated, the test patterns include both the stimuli applied to the unit as well as the response expected. These patterns for good operation are supplied directly to unit under test 10. Using the method of the invention, the unit is tested and an accept indication is provided at 18 or a reject indication at 19 when compared with the expected response. The reject indication may also be supplied as a part of the test generation system to a cause of failure predictor 20, which also receives from test compiler and operation code test generator 17, test data to predict failure operation. This aspect of the test generation system is employed in diagnostic type testing. Cause of failure predictor 20 then provides at 21 the particular failure prediction.

All of the apparatus and program controls necessary for generating the test patterns and performing the tests for the logic portion are known in the art. The testing with an array follows from the aforementioned knowledge and plus using the array to pass test stimulus or results through to the output latch sets. For example, the programs necessary to develop the test patterns for performing combinational tests on unit under test 10 are described in a paper entitled "Algorithms for Detection of Faults in Logic Circuits" by W. G. Bouricius, et al, which was published in Research Report RC3117 by the IBM Thomas J. Watson Research Center on Oct. 19, 1970. An algorithm for the computation of tests for failures is described in "Diagnosis of Automata Failures: A Calculus and a Method" by J. Paul Roth in the IBM Journal of Research and Development, July 1966. These papers described how to develop programmed algorithms for test generation and test evaluation. These include the generation of the assumed fault data necessary for the automatic test generation system.

It is to be understood that the invention of this application does not reside in the generation of the test patterns for application to a unit under test but rather is directed to the method of testing the unit when the patterns are applied to it. To accomplish the testing of a unit with an embedded array as indicated above, the requirements of single-sided delay dependency, scan-in/scan-out capability must be present, the one to one correspondence logic which feeds the array, and the unique detectability of array output patterns must be present in the unit. A generalized logic organization and structure incorporating these concepts is shown in FIG. 2.

Figure 2:
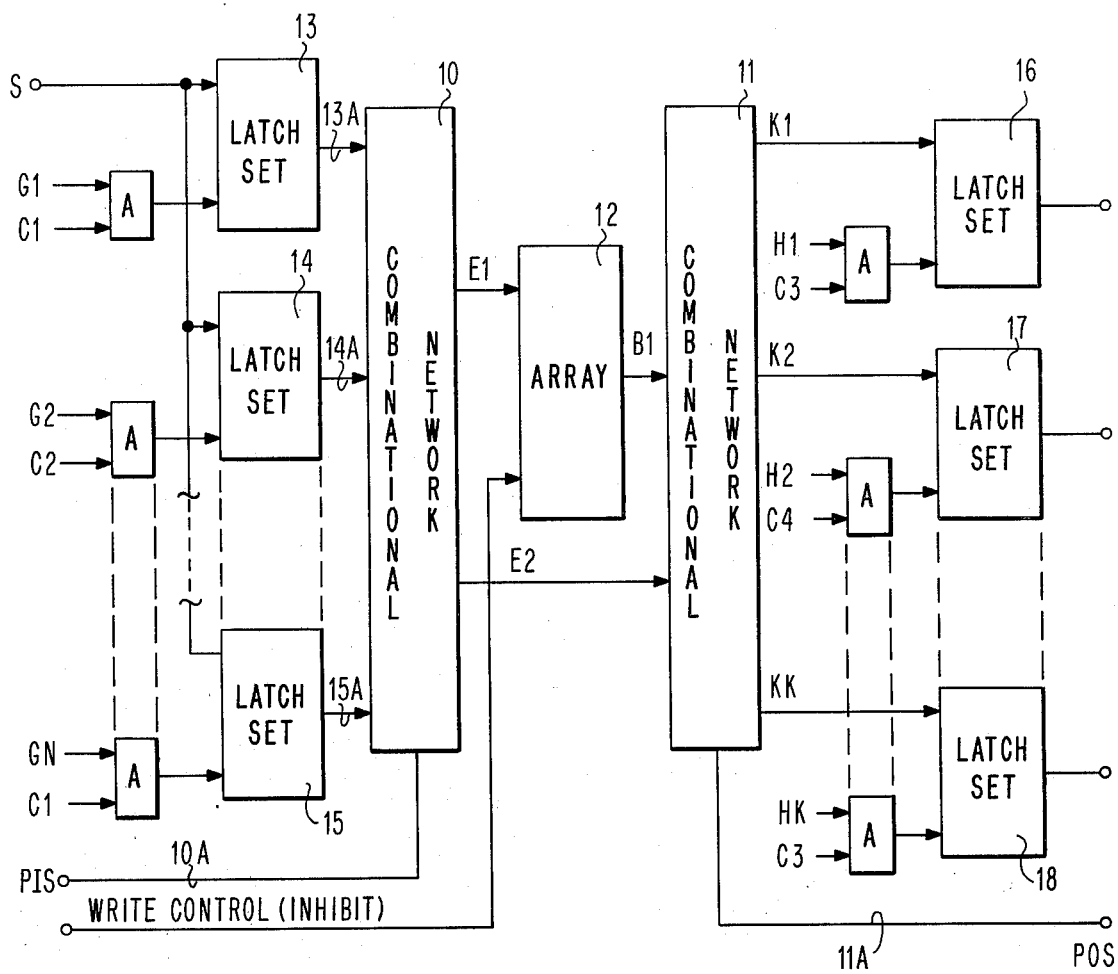
FIG. 2 is a schematic diagram of the organization of a generalized logic system that may be tested utilizing the principles of the invention.
Figure 5:
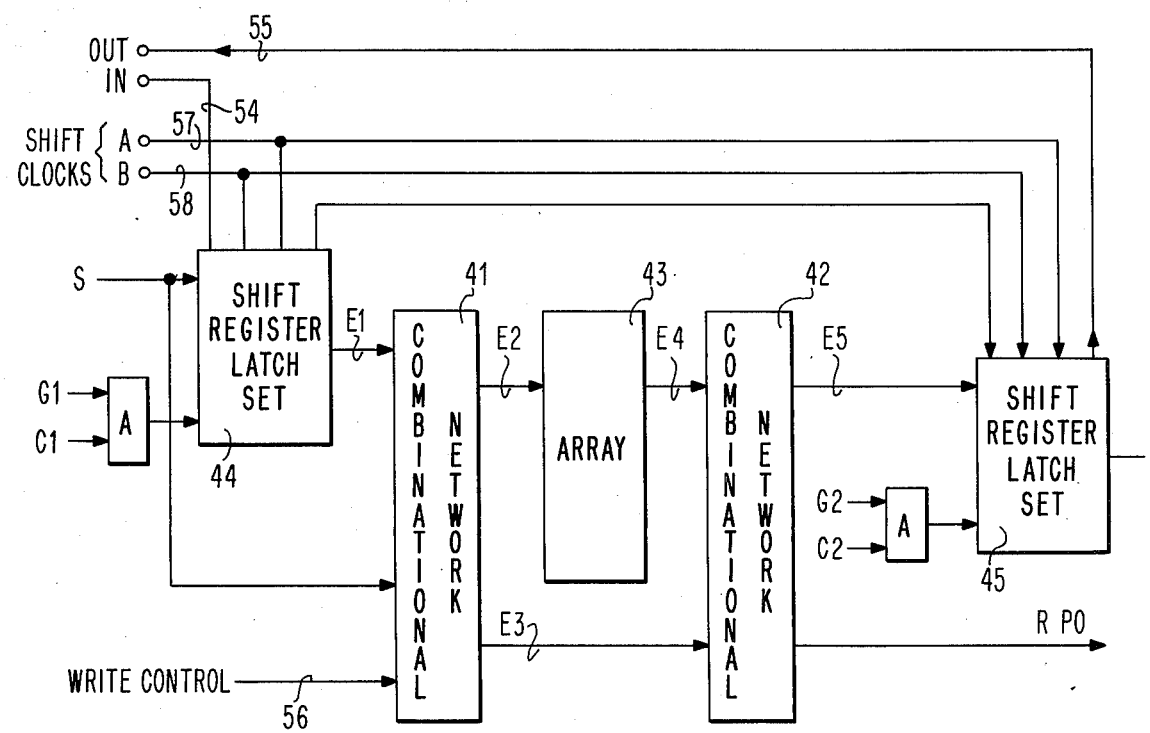
FIG. 5 is a schematic diagram of the organization of a generalized logic system having provision for accomplishing scan-in/scan-out of the system to enable the method of the invention to be performed.

It is to be appreciated that the array as broadly depicted by reference character 12 in FIG. 2 and reference character 43 in FIG. 5, may be a $m \times n$ memory array or a programmable logic array, each of which may be generally of a type well-known to the art. Reference is made to: U.S. Pat. No. 3,593,317, entitled "Partitioning Logic Operations in a Generalized Matrix System", granted July 13, 1971 to H. Fleisher, A. Weinberger and Vaughn D. Winkler on application Ser. No. 889,024 filed Dec. 20, 1969 and of common assignee herewith; U.S. Pat. No. 3,863,232, entitled "Associative Array", granted Jan. 28, 1975 to D. D. Johnson, C. L. Kaufman, F. H. Lohrey and G. J. Robbins on application Ser. No. 428,300, filed Dec. 26, 1973, and of common assignee herewith; U.S. Pat. No. 3,936,812, entitled "Segmented Parallel Rail Paths for Input/Output Signals" granted Feb. 3, 1976 to D. T. Cox, W. T. Devine and G. J. Kelly on application Ser. No. 537,218 filed Dec. 30, 1974 and of common assignee herewith; the article entitled "Hardware Implementation of a Small System in Programmable Logic Arrays", by J. C. Logue, N. F. Brickman, F. Howley, J. W. Jones and W. W. Wu published in the March 1975 issue of the IBM Journal of Research and Development, pages 110 through 119; the article entitled "Introduction to Array Logic" by F. Fleisher and L. I. Maissel published in the March 1975 issue of the IBM Journal of Research and Development page 98 through 109; the article entitled "Array Logic Macros" by J. W. Jones published in the March 1975 issue of the IBM Journal of Research and Development pages 120 through 125; U.S. patent application Ser. No. 534,944, entitled "Time Split Array Logic Element and Method of Operation", filed Dec. 20, 1974, by E. I. Muehldorf now U.S. Pat. No. 3,987,286 granted Oct. 9, 1976 and of common assignee herewith; and U.S. patent application Ser. No. 480,794, entitled "Improved Read/Write Array" filed June 19, 1974, by R. I. Spadavecchia and J. R. Struk and of common assignee herewith.

The configuration of FIG. 2 is formed of a set of combinational logic networks 10 and 11. Network 10 is coupled into the array 12 and is driven by a plurality of latches 13, 14, and 15 and by primary inputs 10A such that under certain conditions there exists a one to one correspondence between the array inputs E1 and the latch lets 13, 14, 15 and/or the primary inputs 10A. The network 11 is coupled into the latch sets 16, 17, 18 and primary outputs 11A. Furthermore, network 11 is driven by the array via B1 and the network 10 via E2. Network 11 has the property that any array pattern at B1 is uniquely detectable at the latch sets 16, 17, 18 and/or the primary outputs 11A. It is to be understood that the structure of this design does not require the primary inputs 10A or the primary outputs 11A. Effectively, the total network is partitioned into embedded array with their associated combinational logic networks along with the set of latches. Although one array partition is shown in FIG. 2, it is to be understood that any number of array partitions may exist in accordance with the invention.

Each of the combinational networks 10, 11 is a multiple input, multiple output, logic network. It includes any number of levels or stages of combinational circuits which may take the form of conventional semiconductor logic circuits. Each network is responsive to any unique input combination of signals to provide a unique output combination of signals. The output signals, such as E1, E2, are actually sets of output signals so that the symbol E1 stands for $e11, e12 \ldots eln$. Similarly, the sybmols G1, G2 . . . Gn refer to sets of gating signals. The input signals provided to the combinational networks are the external input signals indicated as a set S of such signals. It is to be understood that the term "set" shall mean a single item or a substantial plurality of such items.

To render the generalized structure capable of being tested according to the method of the invention, it is a necessary requirement that a latch, a latch set or array controlled by one clock signal train cannot be coupled back through combinational logic to other latches that are controlled by the same clock signal train. Thus, the output from latch set 16 cannot be coupled back into combinational network 11, as latch set 16, 18 is responsive to clock train C3. However, this latch set can be coupled into a combinational network which is responsive to different clock trains.

The manner in which each latch set is controlled by exactly one clock signal train is for each controlling clock signal $C_i$ to be associated with a latch $L_{ij}$ receiving two other signals: an excitation signal $E_{ij}$ and possibly a gating signal $G_{ij}$. These three signals control the latch so that when both the gating signal and the clock signal are in an "up" state or binary one condition, the latch is set to the value of the excitation signal. When either the clock signal or the gating signal is a binary zero or in a "down" state, the latch cannot change state. It is also to be understood that the clocking may be accomplished by having the clock signal trains act directly on the respective latch sets without utilizing the sets of gating signals G1, G2, G3 and the intermediary AND gates.

Figure 3:
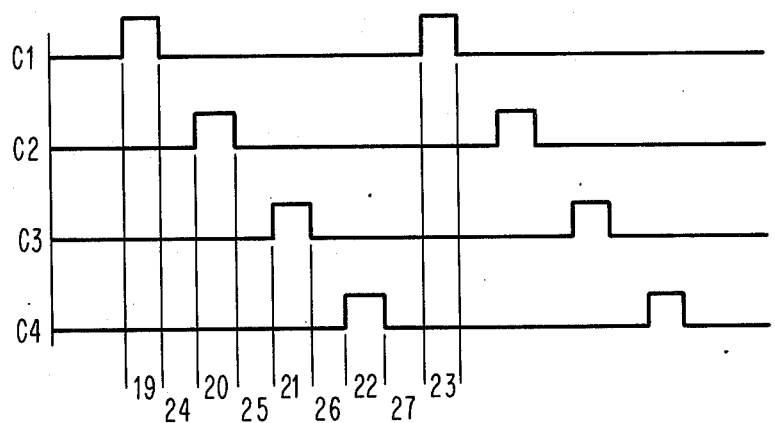
FIG. 3 is a timing diagram of the system clocking employed with the logic system of FIG. 2.

For the normal operation of the logical system, control is exercised by the clock signal trains. With reference to FIG. 3, with the rise of C1 in time frame 19, C2, C3 and C4 are in a "down" or binary zero state and the inputs to the latch sets 13, 14, 15 via S are stable. Clock signal C1 is then gated through to the latch set 13, 14, 15, if the corresponding gating signals G1, G2, GN are at an "up" or binary "one" level. The latches of 13, 14, 15 may be changed during the time that C1 is in an "up" state. The duration of time frame 19 need only be long enough for the latches to be set. The signal changes in the latches immediately propagate through combinational networks 10, 11.

Assume that clock train C2 is used to initiate array operations (either read or write) via the write control input. Before clock signal C2 can change to an "up" or binary one condition, the output signals from latch sets 13, 14, 15 have to complete propagation through combinational network 10. This duration between clock signals C1 and C2 occurs in time frame 24 which must be at least as long as the propagation time through network 10.

When clock signal C2 is changed from a "down" condition to an "up" condition, the array is written or read. C2 must be active, time interval 20, with sufficient duration to complete the read or write operation. The signal changes at the output of the array immediately propagate through combinational network 11. After C2 changes from an active "up" condition to an inactive "down" condition, time interval 25 must be long enough to complete propagation through combinational network 11. Furthermore, the sum of time 19, 24, 20 and 25 must be greater than that of the time required to propagate through networks 10 and 11 via E2. Now that all inputs to latch set 16, 17, 18 are stable and if the gates H1, H2, HK are stable, the clock C3 may change to an "up" level, binary one. C3 must be "up" long enough to set latch set 16, 18 and change to a "down" level, binary zero. Next C4 may change to an active "up" level long enough to set latch set 17 assuming K2 and H2 have been stable. Such an operation meets the requirement for level sensitive system and assumes a mimimum dependence on ac circuit parameters.

Information flows into the level sensitive logic systems through the set of input signals S. These input signals interact within the logic system by controlling them using the clock signals that are synchronized with the logic system. The particular clock time when the signals change is controlled and then the input signal is restricted to the appropriate combinational networks. For example, with reference to FIG. 2, if the set of signals S always changes at clock time C1, the latch sets 13, 14, 15 may be clocked by C2, the array by C3 latch sets 16, 18 by C4 and latch set 17 by C1.

If the external input signals are asynchronous in that they change state at any time, then the manner of handling these signals within the logic system is accomplished by synchronizing them using latches. A latch receives as inputs one of the excitation signals as well as the particular clock signal. As the latch cannot change when the clock signal is at a "down" or binary zero conditions, the output of the latch only changes during the period when the clock pulse is in an "up" or binary one condition. Even if the set of input signals S changes during the time when the clock signal is in the "up" condition, no operational problem occurs provided the set of input signals S remains at its new value for a full clock cycle. A change of state of the latch occurs on the next clock signal. If the latch almost changes, a spike output might appear from the latch during the time when the clock pulse is in the "up" condition. However, this does not create any problems since the output of this latch is employed only during another clock time.

A logic system as shown in FIG. 2 has a single-sided delay dependency. It has one of the capabilities required for carrying out the test method of the invention. The other is the scan-in/scan-out capability.

The storage elements of such a generalized system are level sensitive devices that do not have any hazard or race conditions. Circuits that meet this requirement are generally classified as clocked dc latches. One such latch of this type is the polarity hold latch implemented in FIG. 4 in AND Invert gates. The storing portion of the latch is indicated at 24 with AND Invert gates 25, 26 and inverter 27.

The polarity hold latch has input signals E and C and a single output indicated as an L. In operation, when clock signal C is at a binary zero level, the latch cannot change state. However, when C is at a binary one level, the internal state of the latch is set to the value of the excitation input E.

To utilize the method of the invention, it is necessary that the generalized logic system have the ability to monitor dynamically the state of all internal storage elements. This ability eliminates the need for special test points, it simplifies all phases of manual debugging, and provides a standard interface for operator and maintenance consoles. To achieve this ability, there is provided with each latch in each latch set of the system, circuitry to allow the latch to operate as one position of a shift register with shift controls independent of the system clocks, and an input/output capability independent of the system input/output. This circuit configuration is referred to as a shift register latch. All of these shift register latches within a given ship, module, etc. are interconnected into one or more shift registers. Each of the shift registers has an input and output and shift controls available at the terminals of the package.

By converting the clocked dc latches into shift register latches, the advantages of shift register latches are present. These include the general capability of stopping the system clock, and shifting out the status of all latches and/or shifting in new or original values into each latch. This capability is referred to as scan-in/scan-out or log-in/log-out.

Without the test method of the invention dc level testing required the arrays to be physically partitioned, which allows a simple test of the arrays but is very costly in terms of packaging. If the physical partitioning is not used then a very complex sequential test is required. In the test method of the invention, dc level testing is reduced from either a costly packing approach or sequential complex test to a substantially easier and more effective test of the logic around the array and the array itself.

Scan-in/scan-out provides the necessary capability for accurately diagnosing both design errors and hardware failures for system bring-up, final system tests and field diagnostics. The shift registers are also usable for system functions such as a console interface, system reset, and check pointing.

As is well known in the art, the problem of automatically generating test patterns as described in connection with FIG. 1, for combinational logic networks is relatively simpler than the generation of test patterns for complicated sequential logic circuits. Accordingly, it is necessay to reduce sequential logic circuits such as the internal storage circuit of the generalized logic system to a combinational form. This is accomplished by including additional circuitry for selectively converting the clocked dc latches into shift register latches and by providing the capability for scan-in/scan-out.

Referring to FIG. 5, an illustrate logic system is shown having this additional circuitry and employing two clock signals and two sets of register latches. Combinational networks 41, 42 are of the same type and nature as those described in connection with FIG. 2. They respond to sets of input signals E1, 56, E4, E3. The combinational networks 41, 42 each provides a set of excitation signals E3, E2, E5. Through AND gates, system clocks C1, C2, are gated to the latch sets 45, 44, respectively.

Latch sets 45, 44 differ from those of FIG. 2 in that they are connected as shift register latches. Such a shift register latch is shown in symbolic form in FIG. 6 as including two distinct latching or storing circuits 47, 48. Latch 47 is the same as the latch circuits employed in the latch sets of FIG. 2 and as shown in one form in FIG. 4. Each such latch has an excitation input E, a clock signal train input C, and an output indicated as L.

Latch 48 is the additional circuitry so as to render the structure as a shift register latch. It includes a separate input U, a separate output V, and shift controls A and B. The implementation of the shift register latch in AND invert gates is shown in FIG. 7.

Figure 4:
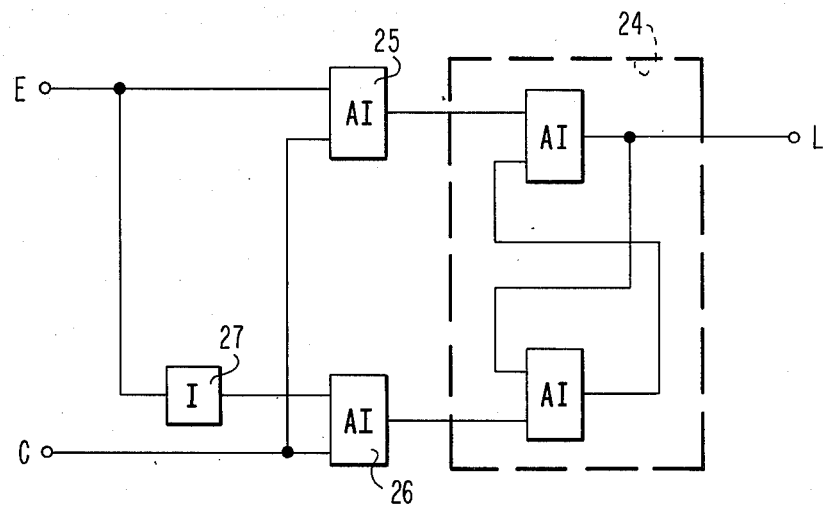
FIG. 4 is a block diagram of one form of a clocked dc latch implemented in AND Invert gates for use in the logic system of FIG. 2.

Indicated in dotted line form is latch 47 which is the same as the latch of FIG. 4. The additional input U is provided through AND Invert logic including gates 49, 50 and inverting circuit 51. This circuitry also accepts the first shift control input A on line 57. From these gates 49, 50 coupling is made to the latch circuit 47. From the outputs of latch 47, there is coupled a second latching circuit including the storing configuration 52 and the AND Invert gates 53, 54 which accept the outputs from the latch configuration of circuit 47 as well as the second shift control input B on line 58.

Circuit 52 acts as a temporary storage circuit during the shifting in and shifting out operation of the arrangement. These shift register latches are employed to shift any desired pattern of ones and zeros into the polarity hold latches 47. These patterns are then employed as inputs to the combinational networks. The outputs from circuit 47 are then clocked into the latch circuit 52 and shifted out under control of shift signal B for inspection and measurement.

Figure 7:
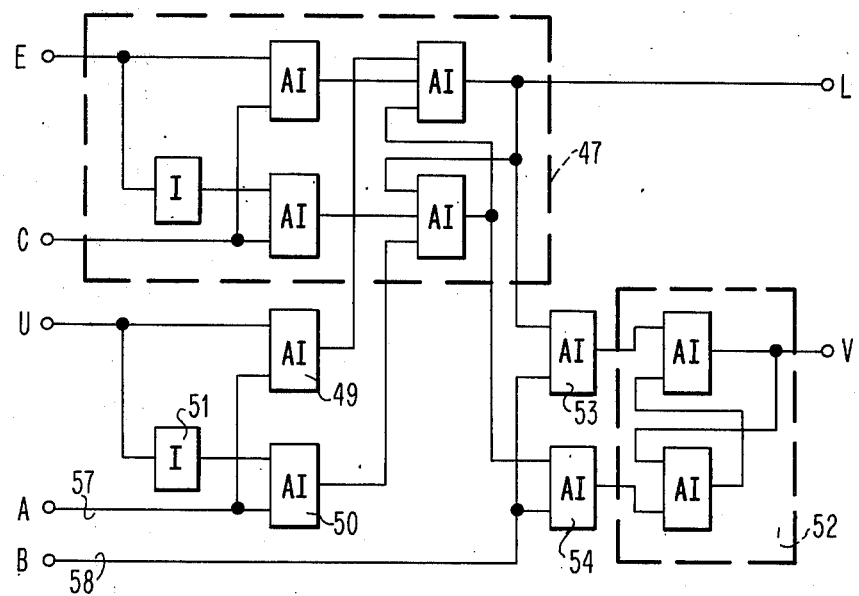
FIG. 7 is a block diagram of a clocked dc latch employed in the structure of FIG. 5 which includes provision for scan-in/scan-out.

Referring again to FIG. 5, each of the latch sets, 45, 44 includes a plurality of the circuits shown in FIG. 7. The circuits are sequentially connected together such that the U input of FIG. 7 would be the input line 54 of FIG. 5. The A shift clock is applied to the first circuit (for example, circuit 47) of all of the latches of the sets. Similarly, the B shift clock is applied to the second circuit of each latch of the latch sets. The V output from circuit 52 of FIG. 7 would be coupled as the input to the next succeeding latch of the set until the last such latch of the entire register when this output would be the equivalent of the output line 55 from the arrangement of FIG. 5. These shift register latches are, therefore, interconnected with an input, an output and two shift clocks into a shift register.

With the requirements of single-sided delay dependency and a scan-in/scan-out capability as described in connection with FIG. 5, test patterns from the test compiler and operation code test generator 17 of FIG. 1 may be provided to unit under test 10 for carrying out the method of the invention. With the system clocks in the off state as in Block 80 of FIG. 8, the shift register formed of shift register latch sets 45, 44 of FIG. 5 is first tested. Test patterns 79 from compiler and generator 17 are applied on input line 54 sequentially to the latches of set 44 as in Block 81. The effect of having the system clocks in the off state is to isolate the shift register from the rest of the circuitry. This control of the system clocks is exercised at the input/output connections for the particular modular unit under test. The stimulus part of the test patterns consists of a pattern of binary ones and zeros. After being applied to latch set 44, they are shifted through latch set 45 to output line 55. The shifting is accomplished under the control of shift clocks A and B on lines 57, 58 respectively. As is evident from FIG. 7, shift clock A acts on the first latch 47 and shift clock B on the second latch 52 of the shift register latch. The output provided on line 55 is measured against the expected response from the test patterns 79. This measurement is performed in Block 82. The purpose of this test is to assure that the shift register performs as required. If the measurement indicates that the shift register is bad, the unit under test is rejected at 83. On the other hand, if the measurement is good, the actual level sensitive testing of the circuitry of the unit is performed.

In the next step of the method of the invention in Block 84, stimulus in the form of a particular pattern is provided on input line 54 to the shift register and is shifted into the latches of the register formed by the sets 45, 44. The purpose of this is to initialize the states of the circuits in the shift register to negate the effects of any prior history for the sequential circuits of the unit under test.

Figure 9:
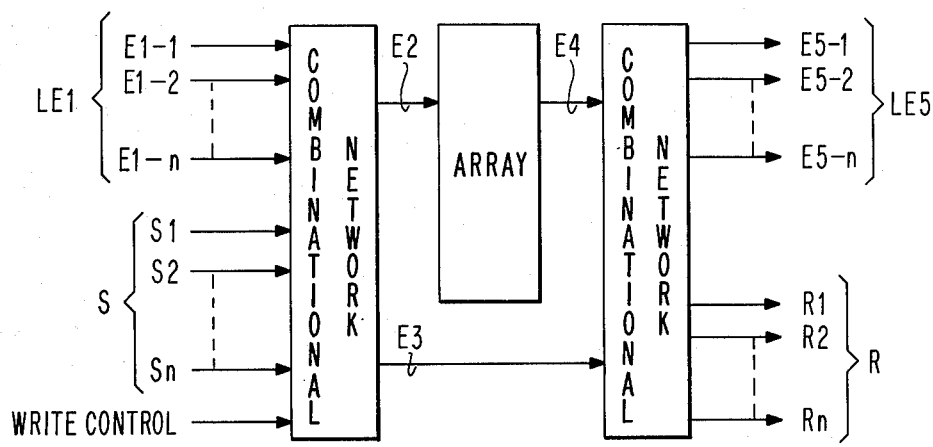
FIG. 9 is a diagram indicating how the test generator of FIG. 1 views a combinational logic network of a functional logic unit when performing the method of the invention.

Effectively, then the automatic test generation system of FIG. 1 sees the circuit of FIG. 9. It is an array with combinational network at its inputs and a combinational network at its outputs. There are real primary inputs S made up of the subsets S1, S2, . . . , Sn and real primary output set R made up of the subsets R1, R2, . . . , Rn. In addition, from the latch sets to the combinational network 41 effectively pseudo input sets LE1 made up of the responses from the test pattern shifted into the shift register. In addition, pseudo outputs LE5 are provided. If the gates, G2, are from primary inputs, the test generation system has control of them directly. If the gates G2, are from network 41 or 42, then the test generation system has indirect control over them. However, the system is capable of sensitizing them as required with little difficulty. The test generation system provided stimulus to network 42 via E4 by writing into the array the pattern required on the output of E4 followed by a read operation. This is done by using one to one capability of the combinational network 41. By writing into the array via E2, the output of network 41 can be observed by reading the array and using the uniquely detectable structure of the combinational network 42. The testing of the functional logic unit which is actually formed of combinational logic networks, arrays and sequential circuits is effectively reduced to testing of an array surrounded by combinational logic, with special properties, by having the ability to scan-in and scan-out test patterns and also to independently operate on the various networks of the configuration by means of the independent clock inputs C1, C2, . . . , Cn.

With the test pattern in the various stages of the shift register, the same test pattern is applied as the system input set S at 85. This pattern applied as set S propagates through combinational networks 42, 41 in FIG. 5 as in Block 86. The set of outputs is measured against the expected response from the particular test pattern applied via the shift register as in Block 87. If a bad indication is obtained, the unit under test is rejected. However, if a good indication is obtained, the array is either written into or read out of depending on the test patterns 79 as in Block 94. The set of inputs is measured against the expected responses from the particular test pattern applied via the shift register as in Block 95. If a bad indication is obtained, the circuit under test is rejected. However, if a good indication is obtained, one of the system clocks is exercised by raising it for the required duration and then lowering it as in Block 88. For example, if clock C2 is exercised, then the set of excitation inputs E5 is shifted into latch set 45. The clock control can be exercised directly by acting on the latch set or as shown in FIG. 5 in conjunction with the set of gating signals G2 through AND gate.

With clock C2 in an "on" condition for the period of time necessary to set the various latches in latch set 45 and then lowered to an "off" condition, the system clocks are then all set to an "off" condition as in Block 89. The indications stored in latch set 45 are then shifted out on line 55 under control of shift clocks A and B (Block 90). The output from the shift register provided at line 55 is measured versus the expected response for that test pattern (Block 91). Rejection of the unit under test at 83 occurs if the measurement indicates a fault in the unit under test. If the measurement indicates that the unit is good, interrogation is made at 92 as to whether the test is complete for that unit. If it is not complete, the process is repeated by applying the same or a different pattern to the shift register as in Block 84. As a practical matter, hundreds and possibly thousands of such patterns are applied to a particular unit under test in order to exercise all of the circuits within the unit and to assure a lack of faulty operation so that it is reasonably expected that the unit would perform the function for which it was intended in an actual logic system. If all of the tests are completed on a particular unit, it is accepted at 93.

Any partitioning of the general structure shown in FIG. 5 results in a functional unit structure that may be tested in the same manner. All of the logic gates and arrays are tested with combinational test patterns by applying the appropriate test patterns at the set of inputs S and at the shift register input and by shifting them through the shift register latches serially. The output patterns can be obtained from the response outputs R and by shifting out the bit pattern in the shift register. This same method of testing is applicable irrespective of the level of packaging, such as the chip, module, card, board and system level.

Figure 6:
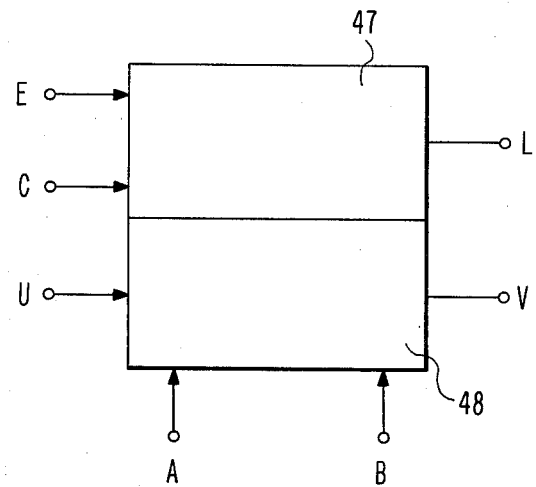
FIG. 6 is a symbolic representation of a latch configuration to be employed in the generalized structure of FIG. 5.
Figure 10:
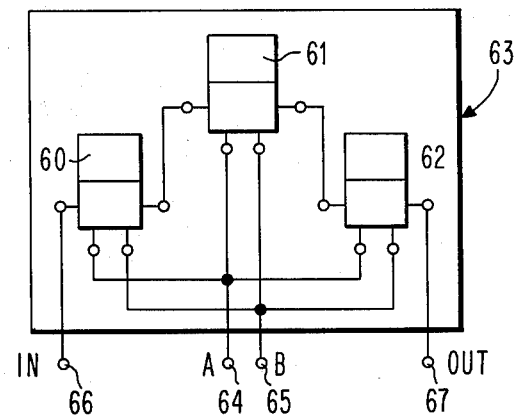
FIG. 10 is a symbolic illustration of the manner in which a plurality of the latches of FIG. 6 are interconnected on a single semiconductor chip device.

In FIG. 10, three latches of the type shown symbolically in FIG. 6 are indicated at 60, 61, 62, on chip 63. Each of the latches is coupled to shift controls A and B provided on lines 64, 65, respectively. The input pattern is provided to the first of these latches 60, through connection 66 and the individual latches are sequentially coupled together as described above in connection with FIGS. 5 and 7, so that the output is obtained on line 67.

Figure 11:
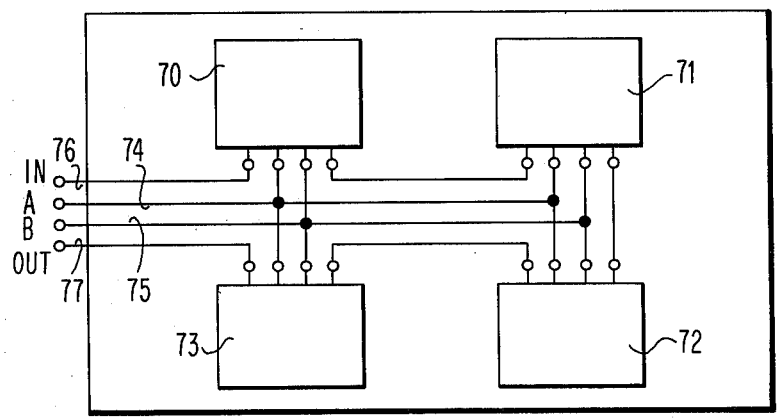
FIG. 11 is a symbolic illustration of the manner in which a plurality of such chip configurations as shown in FIG. 10 are interconnected on a module.

In FIG. 11, four such chips as shown in FIG. 10 are coupled together and indicated at 70, 71, 72, 73. Each of the shift controls A and B is provided through connections 74, 75 to each of the chips 70-73. The input pattern is provided to the first such chip in the sequential connection chip 70 through line 76, and the output is taken from line 77 from the sequentially connected chips 70-73.

With the method of the invention, dynamic measurements of logic networks that are buried within a particular logic package may be made. This is accomplished using the scan-in/scan-out capability of the logic package. The field servicemen debugging the machine or servicing it to monitor the state of every latch in the system can accomplish it using the method of the invention. This is achieved on a single cycle basis by shifting all the data in the latches to a display device. It does not disturb the state of the system, if the data is also shifted back into the latches in the same order as it is shifted out. Thus, the status of all latches is examined after each clock signal.

By having the ability to examine the status of all latches according to this method, the need for special test points is eliminated, allowing the logic designer to package the logic as densely as possible without concern for providing additional input/output lines for the field service engineer. With the ability to examine every latch in a system after each clock signal, any fault that occurs can be narrowed down to a particular combinational logic network whose inputs and outputs can be controlled.

While this invention has been particularly described with reference to the preferred embodiments thereof, it will be understood by those skilled in the art that the foregoing and other changes in form and details may be made therein without departing from the spirit and scope of the invention.

What is claimed is:

1. A method of level sensitive testing a single sided delay dependent embedded array logic unit, said unit including combinational network circuit means having primary input terminals and primary output terminals, said combinational network circuit means including at least a first combinational network and a second combinational network, means including array circuit means interconnecting said first and second combinational networks and sequential circuit means interconnected with said combinational circuit means said sequential circuit means having access for scanning data into said sequential circuit means independent of said primary input terminals and primary output terminals, said method including the steps of:
   (a) scanning in a test pattern, via said scanning access into said sequential circuit means;
   (b) applying the same test pattern, via said primary input terminals, to the combinational network circuit means to provide a primary output at said primary output terminals; and
   (c) comparing said primary output with a known expected response for an indication as to the merit or lack of merit of the unit.

2. The method of level sensitive testing a single sided delay dependent embedded array logic unit, as recited in claim 1, wherein said array circuit means comprises an M × N memory array, and said method includes, after step (b) and prior to step (c) of claim 1, the following steps:
   (a) writing information into said memory array; and
   (b) reading information from said memory array.

3. The method of level sensitive testing a single sided delay dependent embedded array logic unit, as recited in claim 1 wherein said array circuit means comprises a programmable logic array, and said method includes, after step (b) and prior to step (c) of claim 1, the following steps:
  (a) providing an input to said programmable logic array from said combinational network circuit means; and
  (b) providing an output from said programmable logic array to said combinational network circuit means.

4. The method of level sensitive testing a single sided delay dependent embedded array logic unit, as recited in claim 1 wherein said unit is formed on a semiconductor chip and said scanning access of said sequential circuit means includes a single scanning input, a single scanning output and single scanning controls.

5. The method of level sensitive testing a single sided delay dependent embedded array logic unit as recited in claim 1 wherein said unit is contained on a module having a plurality of interconnected semiconductor chips carried thereby and said scanning access of said sequential circuit means includes a single scanning input, a single scanning output and single scanning controls.

6. The method of level sensitive testing a single sided delay dependent embedded array logic unit as recited in claim 1 wherein said unit is a system or subsystem comprising at least first and second interconnected modules each containing a plurality of interconnected semiconductor chips and wherein said scanning access of said sequential circuit means includes a single scanning input, a single scanning output and single scanning controls.

7. The method of level sensitive testing a single sided delay dependent embedded array logic unit, as recited in claim 1, wherein said sequential circuit means comprises at least one shift register having scanning input means, scanning output means and scanning control means.

8. The method of level sensitive testing a single sided delay dependent embedded array logic unit as recited in claim 1 wherein said sequential circuit means comprises sets of sequential circuit means, at least certain sets of said sequential circuit means are selectively connected to additional outputs of said combinational network circuit means, said method including, subsequent to step (c) of claim 1, the further step of:
  (a) gating the additional outputs of said combinational network circuit means to the certain sets of sequential circuit means connected thereto, and thereafter scanning out the resulting state of said certain sets, for an indication of the merit or lack of merit of the unit.

9. The method of level sensitive testing a single sided delay dependent embedded array logic unit, as recited in claim 8, wherein the method of claim 8 is repeated a plurality of times by scanning and applying a plurality of differing test patterns in sequence.

10. A method of level sensitive testing an embedded array logic unit having unit access and controls, a single sided delay dependency and formed of combinational networks, an M × N memory array and sets of sequential circuis coupled together as a shift register having scan access and controls independent of the unit access and controls, each of said sets being controlled by a different clock train, said method comprising the steps of:
  (a) shutting off all of said clock trains to isolate all of the sets from one another;
  (b) scanning a first special test pattern through the shift register via the scan access under the scan controls to determine the fault status of said shift register;
  (c) scanning a second test pattern into the shift register via the scan access under the scan controls;
  (d) applying said second test pattern to said circuitry comprised of said combinational networks and said M × N memory array, through the unit access;
  (e) gating in sequence the outputs of the combinational networks to the associated sets by exercising said clock trains in sequence; and
  (f) scanning out the resulting state of the shift register after each gating for an indication of the merit or lack of merit of the unit.

11. The method of level sensitive testing an embedded array logic unit, as recited in claim 10 wherein the method of claim 12 is repeated a plurality of times by scanning and applying in succession a plurality of different test patterns to said unit to determine the accept/reject status of said unit.

12. The method of level sensitive testing an embedded array logic unit, as recited in claim 10, which includes after step (d) of claim 12 and prior to step (e) of claim 12 the following steps:
  (a) writing information into said memory array; and
  (b) reading information from said memory array.

13. The method of level sensitive testing an embedded array logic unit as recited in claim 10, wherein said M × N memory array comprises a programmable logic array, and said method includes after step (d) iof claim 12 and prior to step (e) of claim 12 the following steps:
  (a) providing an input to said programmable logic array from at least one of said combinational networks; and
  (b) providing an output from said programmable logic array to at least one of said combinational networks.

Figure 8B:
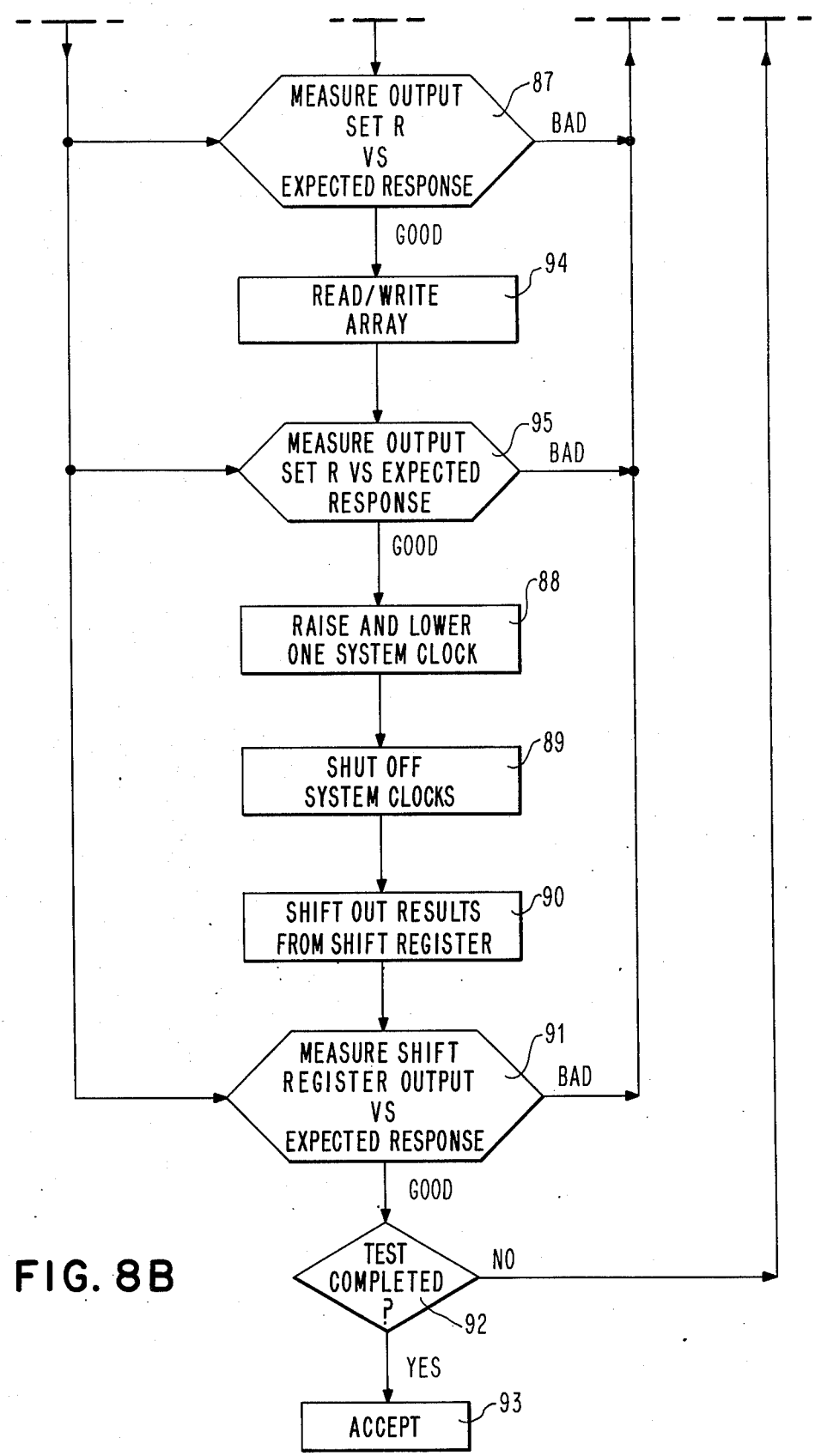

14. A method of level sensitive testing a single sided delay dependent level sensitive functional logic system unit, said logic system unit having embedded array circuit means (FIG. 5), said system unit including:
  a first shift register latch set (44), said first shift register latch set receiving a primary set of input signals (S) under control of a first system clock (C1) to provide a set of output signals (E1);
  a first combinational network (41), said first combinational network receiving said set of primary input signals (S), said first shift register latch set of output signals (E1) and write control signals (56), said first combinational network providing a first set of output signals (E2) and a second set of output signals (E3);
  array circuit means (43), said array circuit means receiving said first set of output signals (E2) from said first combinational network and providing a set of output signals (E4);
  a second combinational network (42) said second combinational network receiving said set of output signals (E4) from said array circuit means and said second set of output signals (E3) from said first combinational network and providing a first set of output signals (E5) and a set of primary output signals (R):
  a second shift register latch (45) set said second shift register latch set receiving said first set of output signals (E5) from said second combinational network under control of a second system clock (C2);

circuit means interconnecting said first shift register latch (44) and said second shift register latch set (45) into a shift register having input means (54), output means (55) and shift control means (shift clock A, shift clock B);

said method comprising the following steps (chart FIG. 8);

(a) shut off system clocks (C1) and (C2) (80, FIG. 8);

(b) via shift register input (54), utilizing shift clocks (A) and (B), shift test pattern through the shift register comprises of shift register latch sets (44) and (45) (79, 81, FIG. 8);

(c) via shift register output (55) compare the output from the shift register with the expected response (79, 82 FIG. 8), if comparison is good proceed to step (d), if comparison is bad, reject unit (83, FIG. 8) and terminate test as to unit under test;

(d) when comparison in step (c) supra is good, via shift register input (54), utilizing shift clocks (A) and (B) shift a test pattern into the shift register comprised of shift register latch sets (44) and (45) (84, FIG. 8);

(e) apply said same test pattern as contained in the shift register to primary inputs (S) (85, FIG. 8);

(f) permit sufficient time for the test pattern applied at primary inputs (S) to propagate through network (41), array (43) and network (42) to primary outputs (R) (86, FIG. 8);

(g) compare the set of primary outputs (R) with an expected good response, if comparison is bad, the unit is rejected and test terminated as to unit under test (87 FIG. 8);

(h) when comparison in preceding step (g) is good, utilizing write control (56) the array is written into by the set of output signals (E1) from first combinational network (41) (Block 94, FIG. 8);

(i) compare the set of primary outputs (R) with an expected good response, if comparison is bad the unit is rejected and the test terminated as to the unit under test (95, FIG. 8);

(j) when comparison in step (i) is good, raise and lower one system clock (C1 or C2) for example, (C2);

(k) with system clocks (C1 and C2) shut off, utilizing shift clocks (A) and (B) shift the data contained in the shift register out of the register;

(l) compare data shifted out of shift register in step (k) with known expected data response, if comparison is bad, reject unit and terminate test as to unit under test;

(m) when comparison in step (1) is good, repeat above steps with same or different patterns until test sequence of patterns is exhausted or unit is rejected.

15. A method of level sensitive testing a single sided delay dependent level sensitive functional logic system unit as recited in claim 14, wherein step (j) system clock (C1) is raised and lowered and system clock (C2) remains shut off.

16. A method of level sensitive testing a single sided delay dependent level sensitive functional logic system unit as recited in claim 14 where in step (h), when comparison in step (g) is good, utilizing write control (56) the array circuit means is read out under control of the set of output signals (E1) from the first combinational network (41).

17. A method of level sensitive testing a single sided delay dependent embedded array logic unit including combinational network circuit means having primary inputs and primary outputs, said combinational network circuit means including array circuit means embedded within said combinational circuit means, and sequential circuit means connected to said combinational network circuit means, said sequential circuit means also having access for scanning means including control means independent of said primary inputs and outputs of said combinational network circuit means, said method including the steps of:

(a) scanning in a test pattern, via said scanning access means into said sequential circuit means;

(b) applying the same test pattern, via said primary inputs, to the combinational network circuit means to provide an output via the primary outputs of said combinational network circuit means;

(c) gating said output from said primary outputs of said combinational network circuit means into said sequential circuit means; and (d) scanning out the resulting state of the sequential circuit means for an indication as to the merit or lack of merit of the unit.

18. The method of level sensitive testing a single sided delay dependent embedded array logic unit, as recited in claim 17 wherein said array circuit means comprises an M × N memory array, and said method includes after step (b) and prior to step (c) of claim 19, the following step:

(a) writing information into said memory array.

19. The method of level sensitive testing a single sided delay dependent embedded array logic unit as recited in claim 17 wherein said array circuit means comprises an M × N memory array and said method includes after step (b) and prior to step (c) of claim 19, the following step:

(a) read information from said memory array.

20. The method of level sensitive testing a single sided delay dependent embedded array logic unit, as recited in claim 17 wherein said array circuit means comprises a programmable logic array, and said method includes after step (b) and prior to step (c) of claim 19, the following steps:

(a) providing an input to said programmable logic array from said combinational network circuit means; and (b) providing an output from said programmable logic array to said combinational network circuit means.

21. The method of level sensitive testing a single sided delay dependent embedded array logic unit, as recited in claim 17, wherein the method of claim 19 is repeated a plurality of times by scanning and applying a plurality of differing test patterns in sequence.

22. A method of level sensitive testing a single sided delay dependent embedded array logic unit including combinational network circuit means having primary inputs and primary outputs, said combinational network circuit means including array circuit means embedded within said combinational circuit means, and sequential circuit means comprising sets of sequential circuit means selectively connected to portions of said combinational network circuit means, said sequential circuit means also having access for scanning means including control means independent of said primary inputs and outputs of said combinational network circuit means said method including the following steps:

(a) scanning in a test pattern, via said scanning access means into said sequential circuit means;

(b) applying the same test pattern, via said primary inputs, to the combinational network circuit means to provide an output via the primary outputs of said combinational network circuit means;

(c) sequentially gating the outputs of at least selected ones of said portions of said combinational network circuit means to their connected set of sequential circuit means; and (d) scanning out the resulting state of at least one set of said sets of sequential circuit means for an indication of the merit or lack of merit of the unit.

23. A method of level sensitive testing an embedded array logic unit having unit access and controls, a single sided delay dependency and formed of combinational networks, array circuit means and sets of sequential circuits coupled together as a shift register having scan access and controls independent of the unit access and controls, each of said sets being controlled by a different clock train, said method comprising the steps of:

(a) shutting off all of said clock trains to isolate all of the sets from one another;

(b) scanning a first special test pattern through the shift register via the scan access under the scan controls to determine the fault status of said shift register;

(c) scanning a second test pattern into the shift register via the scan access under the scan controls;

(d) applying said second test pattern to said circuitry comprised of said combinational networks and said array circuit means, through the unit access;

(e) gating in sequence the outputs of the combinational networks to the associated sets by exercising said clock trains in sequence; and (f) scanning out the resulting state of the shift register for an indication of the merit of the unit.

24. The method of level sensitive testing an embedded array logic unit, as recited in claim 23 wherein the method of claim 23 is repeated a plurality of times by scanning and applying in succession a plurality of test patterns to said unit to determine the accept/reject status of said unit.

25. The method of level sensitive testing an embedded array logic unit, as recited in claim 23, which includes after step (d) and prior to step (e) the following step:

(a) addressing said array circuit means.

26. The method of level sensitive testing an embedded array logic unit as recited in claim 23, wherein said array circuit means is a programmable logic array, and said method includes after step (d) and prior to step (e) the following steps:

(a) providing an input to said programmable logic array from at least one of said combinational networks; and (b) providing an output from said programmable logic array to at least one of said combinational networks.

* * * * *